United States Patent [19]

Gilbert et al.

[11] Patent Number: 5,277,934
[45] Date of Patent: Jan. 11, 1994

[54] METHOD FOR PROTECTING A GRAPHITE CHUCK FOR A STARTER FILAMENT IN THE MANUFACTURE OF POLYCRYSTALLINE SILICON

[75] Inventors: Michael H. Gilbert, North Olmsted; John B. Hedge, Bay Village, both of Ohio; Paul J. Walsh, Salt Lake City, Utah

[73] Assignee: Advanced Ceramico Corporation, Lakewood, Ohio

[21] Appl. No.: 790,079

[22] Filed: Nov. 13, 1991

Related U.S. Application Data

[63] Continuation of Ser. No. 544,611, Jun. 27, 1990, abandoned.

[51] Int. Cl.⁵ .................................. C23C 16/00
[52] U.S. Cl. .................................. 427/249; 427/122; 427/248.1
[58] Field of Search .............. 427/249, 122, 248.1; 428/408; 118/725, 728

[56] References Cited

U.S. PATENT DOCUMENTS 3,286,685 11/1966 Sandmann et al. ............... 118/715
4,621,017 11/1986 Chandler et al. ................. 428/328

FOREIGN PATENT DOCUMENTS 61-076663 4/1986 Japan.
63-074995 4/1988 Japan.
1-009900 1/1989 Japan.
1-176290 7/1989 Japan.

Primary Examiner—Roy King
Attorney, Agent, or Firm—E. Lieberstein

[57] ABSTRACT

The present invention relates to a method for forming a uniform protective outer coating of pyrolytic graphite on a graphite chuck which is used for supporting a started filament in the manufacture of carbon free polycrystalline silicon.

1 Claim, 1 Drawing Sheet

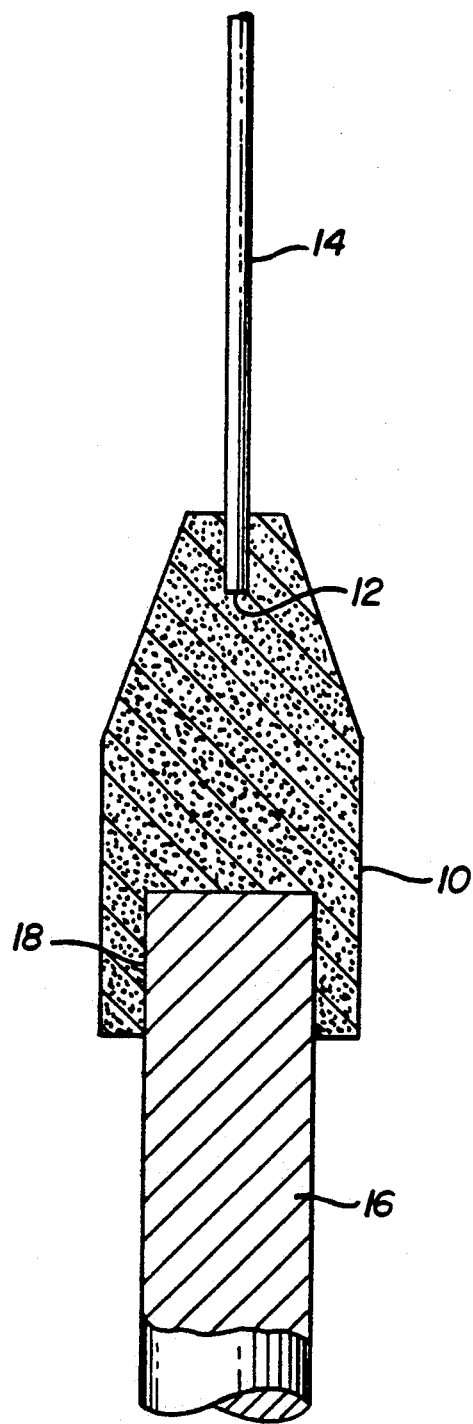

METHOD FOR PROTECTING A GRAPHITE CHUCK FOR A STARTER FILAMENT IN THE MANUFACTURE OF POLYCRYSTALLINE SILICON

This application is a continuation of prior U.S. application: Ser. No. 07/544,611 Filing Date Jun. 27, 1990 now abandoned.

BACKGROUND OF THE INVENTION

1. Field of the Invention

This invention pertains to the field of producing carbon-free polycrystalline silicon by the pyrolysis of a gaseous silicon compound. More specifically, the present invention relates to an improved graphite chuck and to a method of protection for a graphite chuck used to support the heated starter filament which thermally decomposes the gaseous silicon compound such that silicon is deposited on the starter filament without carbon contamination.

2. Discussion of Related Art

Polycrystalline rods are primarily used as precursors for making single crystal rods for the semiconductor industry by either the float zone melting process or by the Czochralski crystal pulling technique. These single crystal rods are then processed to form silicon wafers from which silicon chips are made.

Generally, polycrystalline rods are made by the pyrolytic decomposition of a gaseous silicon compound, such as silane or a chlorosilane (e.g., trichlorosilane) on a rod-shaped, red-heated starter filament made preferably from a silicon seed rod or, alternatively, from a high-melting point metal having good electrical conductivity such as tungsten or tantalum. The principles of the design of present state-of-the-art reactors for the pyrolysis of silane and chlorosilanes are set forth in, for example U.S. Pat. Nos. 3,147,141, 4,147,814, and 4,150,168, which are incorporated herein by reference as if set out in full. It is generally more desirable to prepare the polycrystalline silicon rods by silane pyrolysis so as to avoid the complications caused by the formation of chloride by-products when pyrolyzing chlorosilanes.

The pyrolysis of silane to form silicon and hydrogen, or a chlorosilane which produces chloride-containing compounds such as HCl, $SiHCL_2$ or the like as well as hydrogen, is performed in a reactor consisting of a series of heated filaments, generally silicon rods, surrounded by cooled surfaces. Typically, the filaments are heated by introducing an electrical current through the filament. The process is started with the silicon filament at ambient temperature.

The polycrystalline silicon is produced by heterogeneous decomposition of the silane or chlorosilane on the glowing hot silicon filament rod. The reaction deposits silicon on the surface of the rod and releases hydrogen gas if the silicon is formed by the decomposition of the silane, or hydrogen gas in conjunction with other chloride-containing by-product compounds if the source of the silicon is a chlorosilane.

One of the major objectives in the production of polycrystalline silicon is to produce a silicon rod which is as pure as possible. Even slight amounts of contaminants have a major impact on the efficacy of the silicon chips which are ultimately made from this precursor polycrystalline silicon. The prior art techniques for making polycrystalline silicon have had the problem of coping with various contaminants, including carbon. The present invention is specifically directed to reducing the amount of carbon which may be present in such a polycrystalline silicon rod.

While it has been recognized that carbon is undesirably present as a contaminant in the polysilicon rod, there has been no appreciation or recognition as to what the source of such carbon is or how it is contaminating the polysilicon rod. Indeed, without being able to determine the source for such contamination or the means by which such contamination takes place, a solution to this problem has long been awaited.

SUMMARY OF THE INVENTION

By virtue of the present invention, the source and manner by which the polysilicon rod is contaminated with carbon has been determined. Most importantly, a solution to that problem has also been found such that substantially carbon-free polysilicon rods may now be manufactured.

More particularly, as noted above, the gaseous silicon compound which is used as a source for the silicon, is thermally decomposed by means of the heated starter filament. This filament, typically made of a silicon seed rod, is generally heated by passing an electrical current therethrough. Accordingly, this filament must be held securely in place so as to accommodate the growing polysilicon rod that is being deposited thereon while simultaneously being capable of having an electric current passed through it. Typically, a graphite chuck has been utilized by the prior art in order to accomplish both of these objectives. The graphite chuck is made so that: (1) the starter filament may be securely mounted on it, (2) it can be positioned and seated on an electrode which provides the necessary electrical power for the required current, and, most importantly, (3) is electrically conductive so as to be able to conduct the current from the electrode to the filament.

As a result of the present invention, it has been determined that it is this graphite chuck which is the source of the carbon contamination in the polysilicon product. In particular, it has been determined that the hydrogen being formed as a by-product of the pyrolysis of the gaseous silicon compounds, such as silane or chlorosilane, actually reacts with the graphite, i.e., carbon, to form methane. This methane, in turn, then decomposes when it contacts the heated silicon rod to form carbon and yet additional hydrogen. It is this carbon which finds its way into the polysilicon rod as a contaminant.

Now having found the source and mechanism by which the rods are contaminated, the solution to this problem is providing a hydrogen impervious outer coating layer on the graphite chuck. In this manner, the hydrogen is not able to react with the graphite thereby preventing the formation of the methane.

Accordingly, the present invention, in it's broadest embodiment is directed to a graphite chuck suitable for mounting an elongated starter filament in the production of polycrystalline silicon rods by the pyrolytic decomposition of a gaseous silicon compound on said starter filament having an outer coating layer of pyrolytic graphite.

A method of protecting a graphite structure used in the support of a heated starter filament for forming a polycrystalline rod by the pyrolytic decomposition of a gaseous silicon compound comprising the step of forming an outer coating on said graphite structure by decomposing a hydrocarbon gas at reduced pressure and at an elevated temperature of between 900 to 2100° C.

In prior art unrelated to the production of polycrystalline silicon by means of pyrolyzing silane or chlorosilanes, graphite articles have been coated with various materials. For example, in U.S. Pat. No. 3,406,044 issued to Harris, it is taught that silicon wafers may be surface treated in epitaxial silicon furnaces. The silicon wafers are placed upon a graphite heating element forming part of the epitaxial silicon furnace and then heated. Harris teaches that these graphite heating elements are rather porous and when subjected to high temperatures will emit considerably amounts of gas. Harris further discloses that this gas often reacts with the silicon wafer causing surface imperfections. Here, in order to prevent the escape of such gases from the graphite material, a first layer of silicon is provided on the graphite followed by a second layer of silicon carbide.

In U.S. Pat. No. 4,621,017 issued to Chandler, et al., graphite articles are provided with a silicon carbide coating which is then treated with aluminum phosphate, which infiltrates into both the graphite as well as the silicon carbide overcoat. The purpose of such a coating is to provide a corrosion and wear resistant graphite article which can be rendered substantially resistant to both corrosion, in the form of oxidation, and wear created by the flow of elevated temperature fluids.

BRIEF DESCRIPTION OF THE DRAWINGS

The FIGURE is a cross-sectional diagram of a graphite chuck made in accordance with the present invention showing the starter filament mounted thereon and also showing the chuck seated on an electrode.

DETAILED DESCRIPTION OF THE INVENTION

The structure or design of the graphite chuck is not narrowly critical to the present invention. Generally, the graphite chuck, as its name implies, must be able to securely hold the started filament in place, and be able to be positioned on the electrode.

Referring to the FIGURE, a graphite chuck 10 is shown. This graphite chuck is typically provided with a channel 12 which allows for the mounting of starter filament 14. The clearance between filament 14 and channel 12 of graphite chuck is just enough to allow the introduction of the filament but still provide a snug and secure fit.

Generally, the bottom of the chuck is provided with a means for it to be able to be seated and positioned on electrode 16 which provides the electrical power to the pyrolysis process. Typically, the chuck is provided with a channel shown in the diagram as 18 to allow seating of the chuck on the electrode.

The coating that is provided over the outer surface of the graphite chuck should be inert relative to the graphite body and with respect to any of the reactants, products or by-products of the polysilicon production process, including the electrode upon which the graphite chuck is seated. Moreover, the coating that is provided as an outer protective layer should be effective to substantially prevent hydrogen from being able to come into contact with the graphite and reacting therewith.

It has been discovered in accordance with the present invention that the outer protection desired can be obtained by depositing a pyrolytic graphite layer as the protective outer coating. This is totally unexpected since pyrolytic graphite is a carbon product similar in composition to the graphite body. Moreover, pyrolytic graphite is a conductor and thus can be coated over the entire chuck surface. Pyrolytic graphite may also be deposited as a substantially continuous coating.

The thickness of the layer should be effective to provide the necessary hydrogen imperviousness. This thickness may vary with the particular coating material being used. Generally, the thickness of the hydrogen impervious layer should be at least about 0.1 mil, preferably at least about 1 mil thick, typically in the range of from about 0.5 to about 3 mils. The maximum thickness will not be dictated by effectiveness, for once a minimum thickness is applied to the chuck which will effectively prevent hydrogen from reacting with the graphite, any additional thickness beyond this minimum will generally not provide any further benefit. Beyond this minimum, economics will dictate what the maximum thickness will be.

To form a coating of pyrolytic graphite on a graphite chuck a hydrocarbon gas is decomposed in the presence of the graphite chuck at a pressure preferably less than atmospheric and within a temperature range of between about 900 to 2100° C. The hydrocarbon gas may be diluted with an inert diluent gas such as helium, argon or nitrogen in a ratio of about 10 to 400 parts by volume diluent gas per part volume of the source gas.

The hydrocarbon gas may be any suitable alkane such as methane or propane or an aromatic such as benzene. The preferred hydrocarbon gas is methane.

What is claimed is:

1. A method for forming a polycrystalline rod of essentially pure silicon in a reactor vessel by the pyrolytic decomposition of a gaseous silicon compound on an elongated started filament in the presence of a hydrogen gas, with said started filament being mounted in a graphite chuck within said reactor vessel comprising the step of: decomposing a hydrocarbon gas on said graphite chuck subatmospheric pressure and at an elevated temperature of between 900° to 2100° C. to form a uniform protective outer coating of pyrolytic graphite with a minimum thickness of at least 0.5 microns to suppress the formation of a methane gas in said reactor vessel before proceeding with said pyrolytic decomposition.

* * * * *